US010088299B2

(12) United States Patent
Tokushima (10) Patent No.: US 10,088,299 B2
(45) Date of Patent: Oct. 2, 2018

(54) OPTICAL MEASUREMENT ELEMENT FOR ALIGNMENT IN WAFER-LEVEL TESTING AND METHOD FOR ALIGNING AN OPTICAL PROBE USING THE SAME

(71) Applicants: NEC CORPORATION, Tokyo (JP); PHOTONICS ELECTRONICS TECHNOLOGY RESEARCH ASSOCIATION, Tokyo (JP)

(72) Inventor: Masatoshi Tokushima, Tokyo (JP)

(73) Assignees: NEC CORPORATION, Minato-ku, Tokyo (JP); PHOTONICS ELECTRONICS TECHNOLOGY RESEARCH ASSOCIATION, Bunkyo-ku, Tokyo (JP)

( * ) Notice: Subject to any disclaimer, the term of this patent is extended or adjusted under 35 U.S.C. 154(b) by 0 days.

(21) Appl. No.: 15/641,384

(22) Filed: Jul. 5, 2017

(65) Prior Publication Data

US 2018/0010906 A1 Jan. 11, 2018

(30) Foreign Application Priority Data

Jul. 6, 2016 (JP) ................... 2016-133873

(51) Int. Cl.
*G01B 11/00* (2006.01)
*G01B 11/14* (2006.01)
*G01B 11/27* (2006.01)
*G03F 9/00* (2006.01)

(52) U.S. Cl.
CPC ............ *G01B 11/14* (2013.01); *G01B 11/272* (2013.01); *G03F 9/70* (2013.01)

(58) Field of Classification Search
CPC . G03F 9/70; G03F 9/7088; G03F 9/00; G01B 11/272; H01L 21/681
USPC .......................................................... 356/400
See application file for complete search history.

(56) References Cited

U.S. PATENT DOCUMENTS

| | | | |
|---|---|---|---|
| 7,224,174 B1 | 5/2007 | Malendevich et al. | |
| 2002/0164118 A1 | 11/2002 | Paddon et al. | |
| 2011/0133063 A1 | 6/2011 | Ji et al. | |
| 2012/0328725 A1* | 12/2012 | Minoda ................ | G03F 7/0002 425/150 |
| 2013/0278914 A1* | 10/2013 | Demarest ............... | G01B 11/14 355/72 |
| 2017/0299794 A1* | 10/2017 | Fattal ................... | G02B 6/0016 |

FOREIGN PATENT DOCUMENTS

| | | |
|---|---|---|
| JP | 2004-525417 A | 8/2004 |
| JP | 2011-118399 A | 6/2011 |

* cited by examiner

*Primary Examiner* — Md M Rahman
(74) *Attorney, Agent, or Firm* — Sughrue Mion, PLLC (57) ABSTRACT

An alignment optical measurement element includes a grating coupler, and a reflector coupled to the grating coupler. The alignment optical measurement element is arranged so that: the grating coupler diffracts an incident light in a first direction into a first diffracted light to propagate the first diffracted light as a first propagating light in a second direction, the reflector reflects the first propagating light into a second propagating light in a third direction opposite to the second direction; and the grating coupler diffracts the second propagating light into a second diffracted light to emit the second diffracted light as an emitted light in a fourth direction opposite to the first direction.

8 Claims, 5 Drawing Sheets

OPTICAL MEASUREMENT ELEMENT FOR ALIGNMENT IN WAFER-LEVEL TESTING AND METHOD FOR ALIGNING AN OPTICAL PROBE USING THE SAME

This application is based upon and claims the benefit of priority from Japanese patent application No. 2016-133873, filed on Jul. 6, 2016, the disclosure of which is incorporated herein in its entirety by reference.

BACKGROUND OF THE INVENTION

Field of the Invention

This invention relates to an optical measurement element suitable for alignment in wafer-level testing and a method of aligning an optical probe using the optical measurement element for alignment.

Description of Related Art

Optical integrated circuit technology has made a great progress due to the advance of silicon photonics in recent years. Silicon phonics is a technology for forming waveguides and other optical devices that have silicon cores. Silicon-photonics-based products have a great advantage in availability of mature and cutting-edge complementary metal oxide semiconductor (CMOS) process technologies. Herein, for simplicity, optical chips that include optical integrated circuits (optical circuits) of such waveguides and optical devices are simply called optical chips.

Optical chips manufactured by silicon photonics are, usually, optically coupled to optical fibers coming from outside of the chips for input/output (I/O) of optical signals, where grating couplers are often formed on the optical chips to couple to the optical fibers. Optical integrated circuits on optical chips process signal light, and grating couplers can emit the signal light nearly vertically to the chip surface; consequently, signal light can be input to optical fibers by butt-coupling the fibers to the grating couplers with the beam axes aligned to the fibers. Conversely, by irradiating signal light output from the fibers onto the grating couplers, the signal light can be introduced to the optical chips.

Grating couplers use diffraction phenomenon of light caused by the grating of the grating coupler, to change the propagation direction of signal light by about 90 degrees. This fact causes a disadvantage that the degree of direction change of a grating coupler greatly depends on wavelength and polarization; however, more importantly, that brings an advantage that grating couplers can be freely disposed on an optical chip because the grating couplers are of a surface-I/O type. As a result, in recent years, grating couplers are more often used for optical integrated-circuit chips than optical couplers of an end-face-I/O type.

Grating couplers of a surface-I/O type have another advantage. This is, for example, that they enable wafer-level optical-measurement testing, which is conducted before chip dishing, since there is no need of chip-end faces for optical I/O. Although wafer-level testing is commonly carried out for electronic device chips, it has finally become practical for optical device chips after grating couplers for optical I/O have come to be introduced to such chips.

Basically, "wafer-level testing" means testing individual chips on a full wafer before dicing. Especially in this specification, "wafer level testing" is defined to include a mode of chip testing carried out after further processes have made to the wafer such as wafer-level chip-scale packaging (CSP), in which chips in a full wafer are individually packaged before dicing.

This wafer-level testing before dicing helps to improve handing efficiency. In addition, the wafer shapes and sizes can always be fitted to their standards while chip sizes are changed, which enables us to further standardize testing apparatus than when testing diced chips.

It should be noted that the wafer-level testing defined in this specification may include even the case where diced chips are tested, if the chips are kept tightly on a dicing tape exactly as they were before dicing.

The first step of wafer-level testing for optical devices is to optically align an optical focusing system including optical fibers and lenses to a wafer set in a wafer prober. If grating couplers on an optical chip are coupled to optical fibers after dicing, usually, wafer-level testing is also carried out by coupling the grating couplers to optical fibers before the wafer including the chips is diced. In coupling grating couplers and fibers, optical fibers are optically aligned (positioned) to grating couplers as one step in a testing process. In this event, the alignment is, usually, carried out so that the optical coupling efficiencies between the grating couplers and fiber are maximized. This is because, the practical relative positions of the grating couplers against the optical fibers attached do not necessarily agree with relative positions estimated in designing, due to manufacturing errors and so on. Therefore, U.S. Pat. No. 7,224,174 B1 (which will later be called. Patent Literature 1) proposes determining the optically optimal position relationship between a grating coupler and an optical fiber using a measurement element having grating couplers for alignment, or an alignment measurement element.

The alignment measurement element disclosed in Patent Literature 1 comprises a pair of grating couplers and an optical waveguide for coupling them.

In addition, other prior art documents related to the present invention are known.

For instance, JP 2011-118399A (which will later be called Patent Literature 2) discloses an optical coupler including a grating that may be integrated in a wafer or a chip. Patent Literature 2 also discloses an optical element in which a reflective element such as a distributed Bragg reflector (DBR) is included in a lower portion of the optical coupler in order to reduce optical loss.

In addition, JP 2004-525417A (which will later be called Patent Literature 3 which corresponds to US 2002/0164118 A1) discloses a photonic I/O port which may also called a coupler or a grating coupler. Patent Literature 3 discloses the photonic I/O port comprising a coupling region, an in-plane reflector region located behind the coupling region, an output region, an output waveguide, and an output boundary defining demarcation between the coupling region and the output region. The in-plane reflector region redirects light propagating to exit each respective coupling region in both the +x and −x directions, light existing the I/O ports in the −x direction towards the output region and thus towards the output waveguide.

For the alignment measurement element disclosed in Patent Literature 1, in which two grating couplers are coupled with an optical waveguide, sometimes, the optical waveguide cannot be laid out aptly on an optical chip in which the alignment measurement element is to be included and, as a result, the grating couplers cannot be put at the optimal positions on the chip.

Patent Literature 2 merely discloses an optical coupler including a reflective element under the coupler in order to reduce optical loss. Patent Literature 3 merely discloses a photonic I/O port including an in-plane reflector region for redirecting light towards an output waveguide. In other words, each of Patent Literature 2 and Patent Literature 3 merely discloses an optical I/O grating coupler for optically coupling to an optical fiber.

SUMMARY

It is an objective of the present invention to provide an optical measurement element for alignment (alignment optical measurement element) in wafer-level testing for resolving the above-mentioned problems and a method of aligning an optical fiber using the alignment optical measurement element.

In the first aspect of the present invention, there is provided an alignment optical measurement element comprising a grating coupler and a reflector coupled to the grating coupler. The alignment optical measurement element is arranged so that: the grating coupler diffracts an incident light in a first direction into a first diffracted light to propagate the first diffracted light as a first propagating light in a second direction; the reflector reflects the first propagating light into a second propagating light in a third direction opposite to the second direction; and the grating coupler diffracts the second propagating light into a second diffracted light to emit the second diffracted light as an emitted light in a fourth direction opposite to the first direction.

In the second aspect of the present invention, there is provided a method for aligning an optical probe using the above-mentioned alignment optical measurement element. The method comprising: bringing the optical probe in the vicinity of the grating coupler of the alignment optical measurement element; inputting an emitted light from the optical probe to the grating coupler as an incident light; collecting, into the optical probe, an emitted light from the grating coupler as a collected light; measuring the intensity of the collected light with a photo detector to produce a measured value indicative of the light intensity; and adjusting a relative position of the optical probe with respect to a wafer so that the measured value is maximized.

BRIEF DESCRIPTION OF THE DRAWINGS

The above features and advantages of the present invention will be more apparent from the following description of certain preferred embodiments provided in conjunction with the accompanying drawings, among which.

DETAILED DESCRIPTION OF EXEMPLARY EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Related Art

Before describing the present invention, the related art will be explained in detail with reference to figures in order to facilitate the understanding the present invention.

Figure 1:
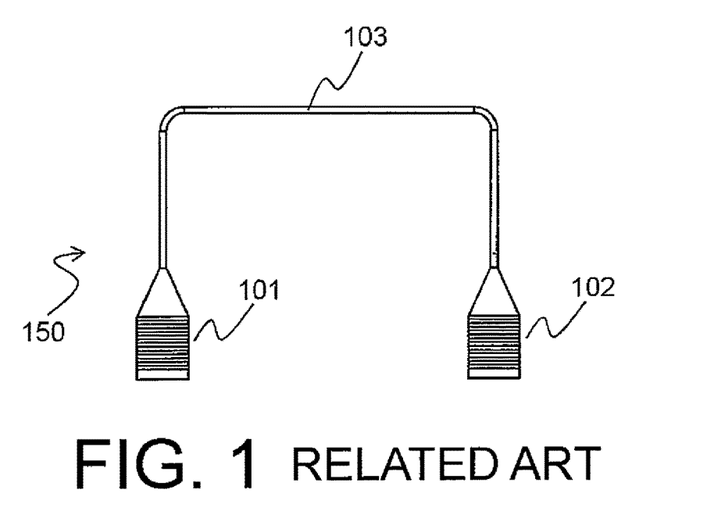
FIG. 1 is a top-view schematic for use in describing an alignment measurement element in a related art.

FIG. 1 is a top-view schematic for use in describing an alignment measurement element in a related art disclosed in Patent Document 1. In FIG. 1, the alignment measurement element 150 comprises a pair of grating couplers 101, 102 and an optical waveguide for coupling them. Herein, one grating coupler 101 is called a first grating coupler while another grating coupler 102 is called a second grating coupler. The method of carrying out alignment using the alignment measurement element comprises inputting a light beam emitted from the first grating coupler to the first grating coupler using a first optical fiber (not shown) to propagate the light beam along the optical waveguide 103, and collecting, into a second optical fiber (not shown), a light beam emitted from the second grating coupler 102 after propagating through the optical waveguide 103. By maximizing the light power received by the second optical fiber, alignment is completed simultaneously at two positions of the input-side and output-side grating couplers (the first and second grating couplers).

Alignment measurement elements such as the element 150 are usually disposed in the vicinity of optical input/output grating couplers of an optical device under test.

Figure 2:
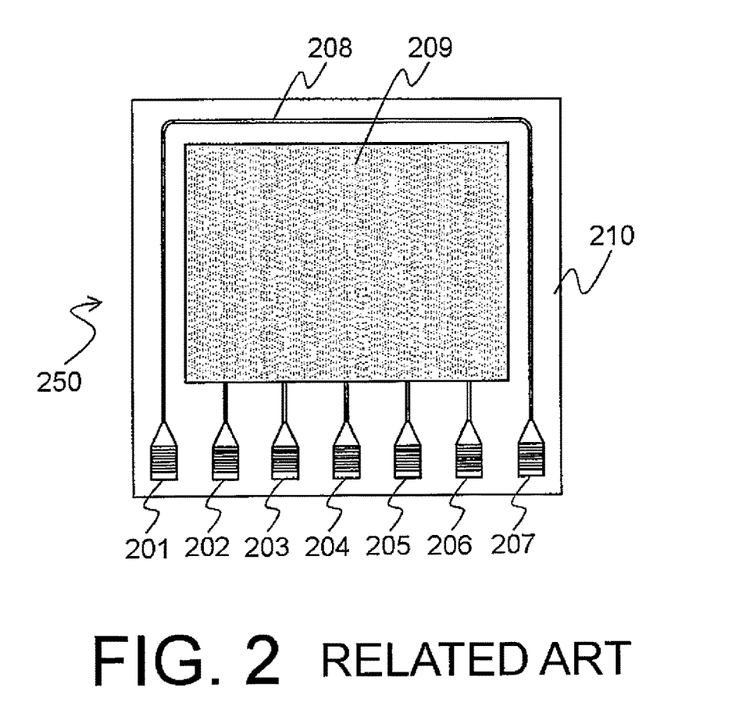
FIG. 2 is a top-view schematic for use in describing, when a plurality of grating couplers are arranged in a line, a mode in which an alignment grating coupler is disposed at both ends of the arrangement.

FIG. 2 is a top-view schematic for use in describing, when a plurality of optical input/output grating couplers are arranged in a line, a mode in which an alignment grating coupler is disposed at both ends of the arrangement. In FIG. 2, an alignment measurement element 250 comprises first and second grating couplers 201 and 207, and an optical waveguide 208 for coupling them to each other. The alignment measurement element 250 is mounted on an optical chip 210. The optical chip 210 comprises a large-scale optical circuit 209. A row of first through fifth optical input/output grating couplers 202 to 206 is coupled to the optical circuit 209. The first and the second grating couplers 201 and 207 are disposed apart from each other on the optical chip 210 so as to sandwich the row of first through fifth optical input/output grating couplers 202 to 206 between them. As a result, when the first through fifth optical input/output grating couplers 202 to 206 in the row are coupled to the large-scale optical circuit 209, the optical waveguide 208 comes to be wired so as to take a long way around the optical circuit 209.

In the mode illustrated in FIG. 2, alignment of arrayed fibers, which may be commercially available, to an optical device under test can be appropriately completed by only aligning the arrayed fibers to the alignment measurement element 250 included in the optical device.

A problem of the mode illustrated in FIG. 2 is that there would be no suitable wiring path of waveguide if the optical circuit 209 came close to the edges of the optical chip 210 leaving insufficient room for waveguide wiring.

Figure 3:
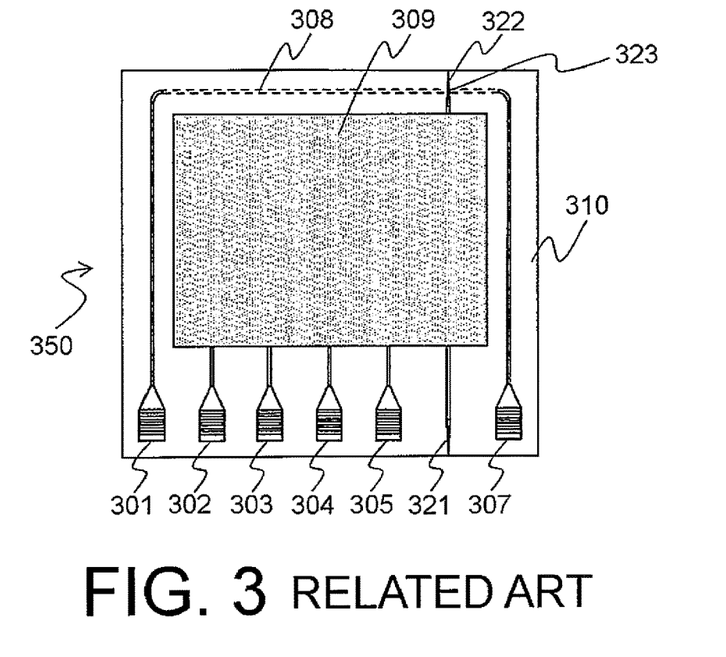
FIG. 3 is a top-view schematic for use in describing, in the mode illustrated in FIG. 2, problems in a case where an end-face-coupling-type optical coupler is mixed in an optical chip.

FIG. 3 is a top-view schematic for use in describing another problematic case which could occur in the mode illustrated in FIG. 2 if an end-face-coupling-type optical coupler were mixed in an optical chip. In a mode of FIG. 3, an alignment measurement element 350 comprises first and second grating couplers 301 and 307, and an optical waveguide 308 for coupling them to each other. The alignment measurement element 350 is mounted on an optical chip 310. The optical chip 310 comprises a large-scale optical circuit 309. A row of first through fifth optical input/output grating couplers 302 to 306 is coupled to the optical circuit 309. The first and second grating couplers 301 and 307 are disposed apart from each other on the optical chip 310 so as to sandwich the row of first through fifth optical input/output grating couplers 302 to 306 between them. First and second optical couplers 321 and 322 of an end-coupling type exist in the optical chip 310. Also in this case, a suitable wiring path of waveguide cannot be found, since, for example, the waveguide 308 might cross the second optical coupler 322 of the end-coupling-type crosses at a position 323.

Now, description will be made as regards respective example embodiments of this invention with reference drawings. A technical scope of the present invention is not limited to those example embodiments and should be interpreted based on the claims.

First Example Embodiment

A first example embodiment of the present invention is an alignment optical measurement element provided to a wafer or an optical chip. The alignment optical measurement element comprises a grating coupler and a reflector coupled to the grating coupler.

Figure 4A:
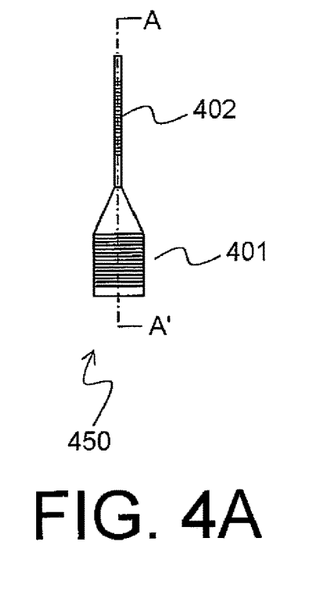
FIG. 4A is a top-view schematic for use in describing an alignment optical measurement element according to a first example embodiment of this invention.
Figure 4B:
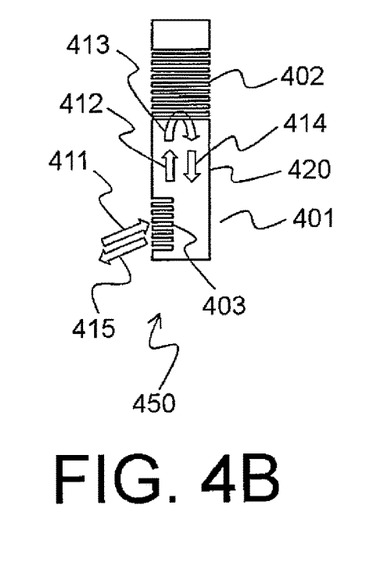
FIG. 4B is a cross-sectional view taken along the line A-A' of FIG. 4A.

FIGS. 4A and 4B are schematic views for use in describing the alignment optical measurement element 450 according to the first example embodiment of the present invention; FIG. 4A is a top view of the alignment optical measurement element 450 while FIG. 4B is a cross-sectional view taken along the line A-A' of FIG. 4A.

As illustrated in the top view of FIG. 4A, the alignment optical measurement element 450 comprises a grating coupler 401 and a reflector 403 including a grating. When the alignment optical measurement element 450 is made by silicon photonics, the core of the structure illustrated in FIGS. 4A and 4B is usually made of silicon and the cladding surrounding the core is another material having a refractive index different from that of silicon. For example, the cladding can be silicon dioxide.

Referring now to FIG. 4B and according to the first example embodiment, it will be described how the alignment optical measurement element 450 works.

The grating couple 401 comprises a core 430 and a coupler grating 403.

When an incident light (beam) 411 output from an end face of an optical fiber (not shown) is input to the grating coupler 401 in a first direction, the incident light 411 is diffracted by the coupler grating 403 of the grating coupler 401 to become a first propagating light 412 which propagates along the core 420 in a second direction. The first propagating light 412 is reflected by a reflector 402 including a grating into a reflected light 413, and the reflected light 413 propagates in the core 420 as a second propagating light 414 in a third direction opposite to the second direction. The second propagating light 414 propagating in the core 420 is diffracted by the coupler grating 403 of the grating coupler 401 into a second diffracted light to be emitted as an emitted light 415 in a fourth direction opposite to the first direction.

The grating of the reflector 402 should have a stop band for the first propagating light 412 for letting the reflector 402 efficiently reflect first propagating light 412. A stop band refers to a frequency range in which light at any frequency is not allowed to propagate in a structure. Generally, a stop band of a grating becomes broader as the refractive-index difference between the material of the core and the material filling its grooves increases. It becomes broader also with an increasingly deeper grating. Therefore, the grating of the reflector 402 illustrated in FIG. 4B has a structure where grooves pass through the core from a top-surface side (the left side of the alignment optical measurement element 450 shown in FIG. 4B) to a bottom-surface side (the right side of the element 450 shown in FIG. 4B). In addition, the refractive indices of silicon and silicon dioxide are 3.504 and 1.447, respectively, for light having a wavelength of 1310 nm in a vacuum, and thus the difference of the refractive indices are sufficiently large. Therefore, a broad stop band for the first propagating light 412 can be obtained by only adjusting appropriately the width and period of the grooves.

A function of the alignment optical measurement element 450 is to output the emitted light 415 at the same position and angle as those at which the incident light 411 is input.

Mainly two kinds of information can be obtained by inputting the incident light 411 output from the optical fiber to the alignment optical measurement element 450, collecting the emitted light 415 returning from the element 450 with the same fiber, and maximizing the intensity of the collected light by adjusting relative positions. One is that the coupler grating 403 of the grating coupler 401 and the polarization of the incident light 411 are in a certain relation (in many cases, the grating and the electric field of the incident light 411 are parallel to each other). Another kind of information is that the relative positions of the coupler grating 403 and the optical fiber to each other are optically optimized, when they are well aligned. Furthermore, if the optical fiber used is a single mode fiber, the coupling efficiency of the grating coupler 401 and the optical fiber can be measured when the alignment is completed, as follows; express in decibel the ratio of the intensity of the light output from the optical fiber to the grating coupler 401 to that of the light collected in the optical fiber after being output from the grating coupler 401, and then divide the number of the ratio by two. In calculating the coupling efficiency, the reflectivity of the reflector 402 is assumed to be 100%. In practice, the reflector 402 can be manufactured to exhibit a reflectivity very close to 100%. As described above, when the alignment optical measurement element 450 is provided on a wafer, it is possible to align the alignment optical measurement element 450 and the optical fiber or the like and measure the optical coupling loss between them.

As illustrated in FIGS. 4A and 4B, the alignment optical measurement element 450 of the first example embodiment includes only one grating coupler it is therefore unnecessary to connect a plurality of grating couplers positioned apart from one another on a wafer with the optical waveguide, which leads to a remarkably higher degree of freedom in arranging the alignment optical measurement element 450 than the related art. Accordingly, if only there adequate space can be found for placing the alignment optical measurement element in question on a wafer, the alignment optical measurement element 450 can readily be placed there without any restrictions. For instance, the alignment optical measurement element 450 can be placed inside a ring-shaped waveguide or between two parallel waveguides.

Figure 8:
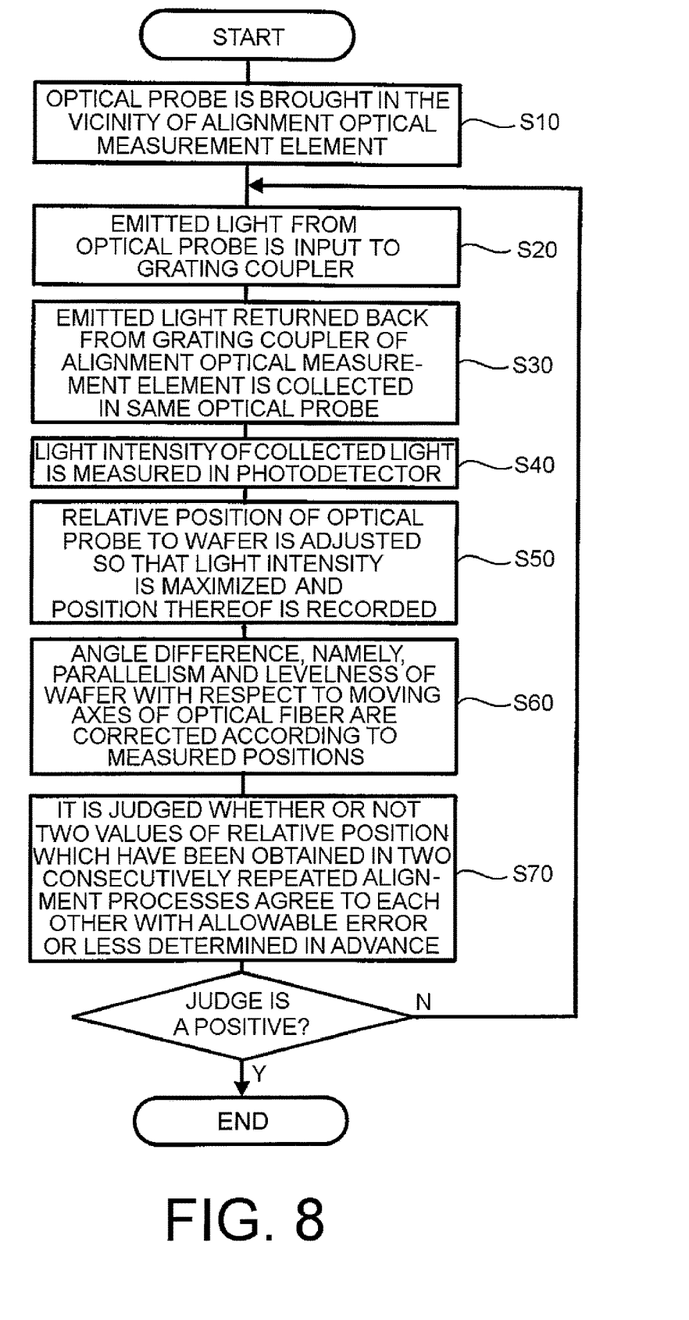
FIG. 8 is a flow chart for use in describing an alignment method for wafer test using the alignment optical measurement element illustrated in FIGS. 4A and 4B.

Referring now to FIG. 8, the description will proceed to an alignment method for a wafer testing using the alignment optical measurement element 450 according to the first example embodiment. It is assumed that one or more alignment optical measurement elements 450 are formed on the wafer.

FIG. 8 is a flow chart for use in describing an alignment method for the wafer testing using the alignment optical measurement element 450 according to the first example embodiment.

First, an optical probe (not shown) is brought in the vicinity of the grating coupler 401 of the alignment optical measurement element 450 (step S10). For instance, an output end of an optical fiber serving as the optical probe is brought roughly in the vicinity of the grating coupler 401 of the alignment optical measurement element 450.

Subsequently, an emitted light from the optical probe is input as the incident light 411 to the grating coupler 401 in the first direction (step S20). In the step S20, the emitted light 411 is irradiated from the optical probe to the coupler grating 403 of the grating coupler 401.

Next, the emitted light 415 returning from the grating coupler 401 of the alignment optical measurement element 450 is collected with the same optical probe (step S30). The emitted light 411 from the optical probe, which is input to the coupler grating of the grating coupler 401 in the first direction in the step S20, is diffracted by the coupler grating 403 of the grating coupler 401, as described above, to propagate as the first propagating light 412 in the alignment optical measurement element 450 in the second direction. The first propagating light 412 is reflected by the reflector 401 to propagate as the second propagating light 414 in the alignment optical measurement element 450 in the third direction opposite to the second direction. The second propagating light 414 is diffracted by the coupler grating 403 of the grating coupler 401 into the second diffracted light to be emitted as the emitted light 415 from the grating coupler 401 in the fourth direction opposite to the first direction. Then, the emitted light 415 is input to the optical probe.

Subsequently, the intensity of the collected light is measured with a photodetector (not shown) (step S40). An optical power meter may be used as the photodetector. Note that the "light intensity" means an optical power (a unit: W or mW).

Next, the relative position of the optical probe to the wafer is adjusted so that the measured light intensity is maximized, and then the relative position thereof is recorded (step S50). If there are a plurality of alignment optical measurement elements 450, the same optical probe is moved in the vicinity of a second alignment optical measurement element, the light intensity is maximized, and the position thereof is recorded in the same manner. If necessary, the same operation is carried out for a third or more alignment optical measurement elements.

Subsequently, the angle difference, namely, the parallelism and the levelness of the wafer with respect to moving axes of the optical fiber are corrected according to the measured positions (step S60).

Next, after repeating the steps S20 to S60, it is judged whether or not two values of relative position which have been obtained in two consecutively repeated alignment processes agree to each other with an allowable error or less determined in advance (step S70). If the judge is a positive, the alignment process comes to end; if the judge is a negative, another alignment process is repeated by returning to the step S20. Particularly the initial alignment process necessarily follows the second process by returning to the step S20.

The reflector 402 of the alignment optical measurement element 450 may have a function of reflecting light by about 100% but may not necessarily comprise a grating as described in the first example embodiment.

Second Example Embodiment

Figure 5:
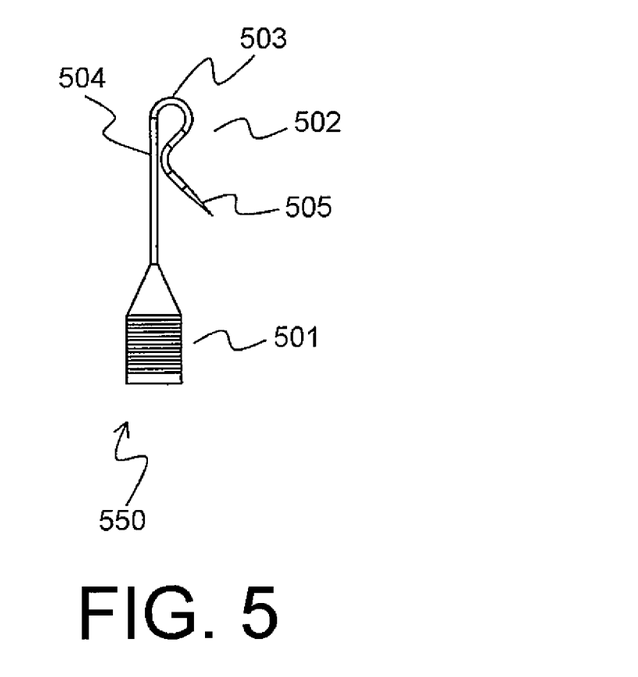
FIG. 5 is a top-view schematic showing an alignment optical measurement element according to a second example embodiment of this invention.

FIG. 5 is a top-view schematic showing an alignment optical measurement element 550 according to a second example embodiment of this invention.

The alignment optical measurement element 550 illustrated in FIG. 5 comprises a grating coupler 501 and a reflector 502. The reflector 502 comprises a loop waveguide 503 with a directional coupler 504. The reflector 502 of the alignment optical measurement element 550 is configured to connect to the grating coupler 501 through the directional coupler 504 and return light with the loop waveguide 503. The loop waveguide 503 acts as a loop mirror. At a proper wavelength of light, the whole light power returned by the loop waveguide 503 is to come back to the grating coupler 501. The waveguide tip 505 emits light without back reflection into the loop waveguide when part of light returned by the loop waveguide happens to come to the waveguide tip 505.

The optical loss of the reflector can be suppressed to be small, since the reflector 502 of the alignment optical measurement element 550 illustrated in FIG. 5 can be composed of only dielectrics similarly to the reflector 402 of the alignment optical measurement element 450 illustrated in FIG. 4A.

Third Example Embodiment

Figure 6:
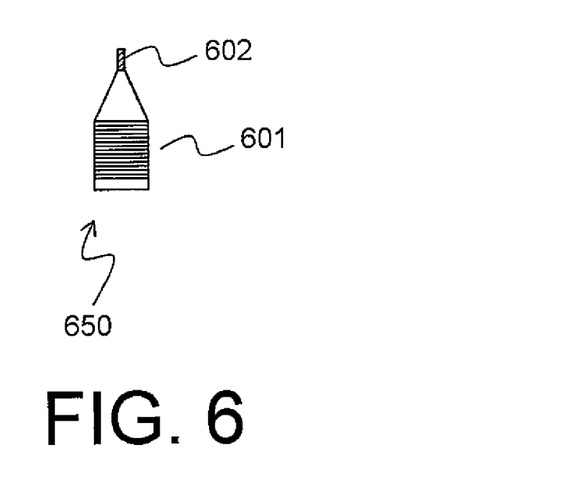
FIG. 6 is a top-view schematic showing an alignment optical measurement element according to a third example embodiment of this invention.

FIG. 6 is also a top-view schematic showing an alignment optical measurement element 650 according to a third example embodiment of this invention.

The alignment optical measurement element 650 illustrated in FIG. 6 comprises a grating coupler 601 and a reflector 602. The reflector 602 comprises a reflective component of a metal such as gold and has a high reflectance. The reflector 602 of the alignment optical measurement element 650 is configured to connect to the grating coupler 601 and return light at its reflective surface.

Since the reflector 602 of the alignment optical measurement element 650 illustrated in FIG. 8 is composed of a metal, its optical loss may be slightly larger than that of a reflector composed of only dielectrics. However, it is advantageous that the size of the alignment optical measurement element 650 can be reduced by adopting the reflector 602 being small.

Alignment methods when using the alignment optical measurement elements 550 and 650 of the second and the third example embodiments can be an alignment method similar to that for the alignment optical measurement element 450 of the first example embodiment.

If the optical probe comprises arrayed fibers, there can be no need to further prepare optical fibers only for alignment in addition to the arrayed fibers when using the alignment optical measurement elements 450, 550, and 650 according to the first through the third example embodiments of the present invention.

Fourth Example Embodiment

Figure 7A:
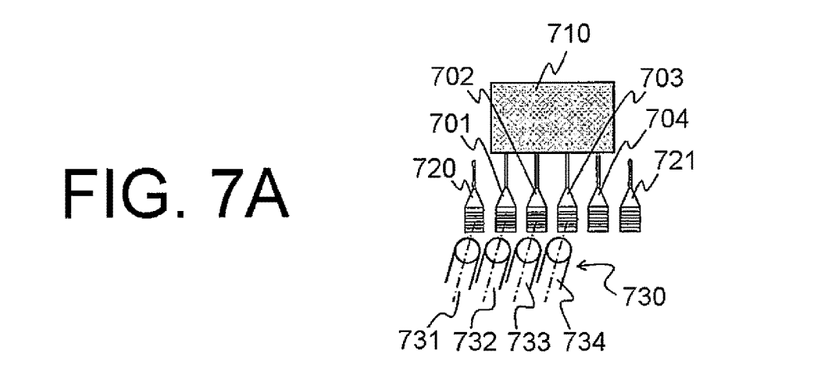
FIGS. 7A to 7C are top-view schematics for use in describing an alignment method according to a fourth example embodiment of this invention in a case where an optical probe comprises arrayed fibers.
Figure 7B:
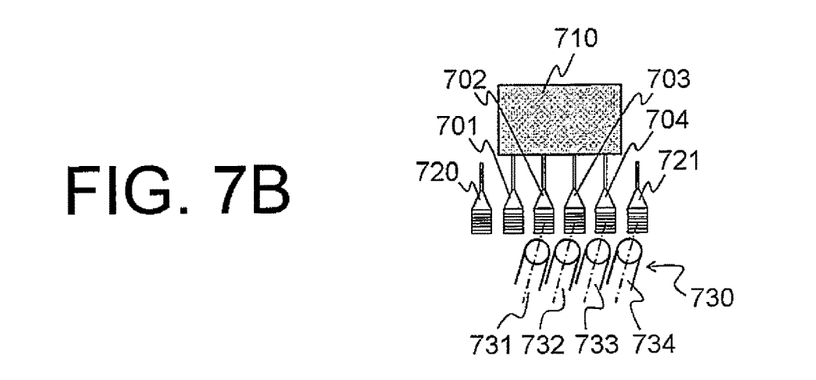
Figure 7C:
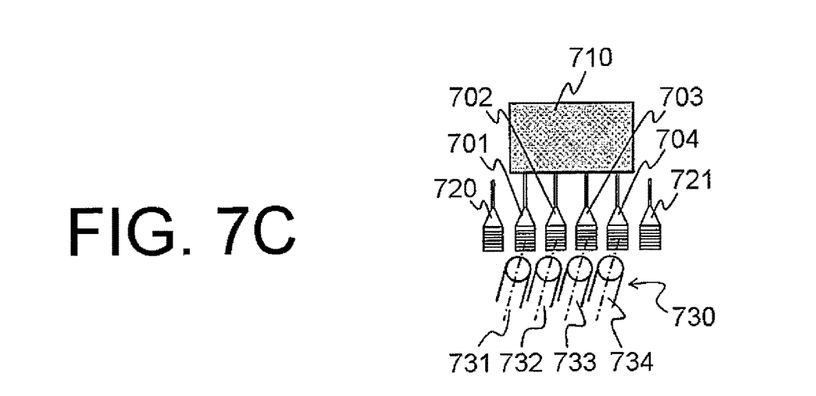

FIGS. 7A to 7C are top-view schematics for use in describing an alignment method according to a fourth example embodiment of this invention in a case where the optical probe comprises arrayed fibers.

In FIGS. 7A to 7C, it is assumed that there are first through fourth optical input/output grating couplers 701, 702, 703, and 704 projecting from an optical circuit 710 in one optical chip, and they are arranged in a row at a constant interval. It is also assumed that arrayed fibers 730 including first through fourth optical fibers 731, 732, 733, and 734, which are arranged at the same interval as that of the first through fourth input/output grating couplers 701 to 704, should be finally aligned simultaneously with the first through fourth input/output grating couplers 701 to 704. First and second alignment optical measurement elements 720 and 721 are disposed on both sides of the first through fourth input/output grating couplers 701 to 704. Specifically, the first alignment optical measurement element 720 is disposed on the left side while the second alignment optical measurement element 721 is disposed on the right side. The first optical fiber 731 is the leftmost optical fiber of the arrayed fibers 730 while the fourth optical fiber 734 is the rightmost one.

First, as shown in FIG. 7A, optical alignment between the first optical fiber 731 and the first alignment optical measurement element 720 is carried out. Subsequently, as shown in FIG. 7B, optical alignment between the fourth optical fiber 734 and the second alignment optical measurement element 721 is carried. Using results of these alignment processes, corrections are made on parallelism, levelness, relative positions, relative heights, or the like between the arrayed fibers 730 and the optical chip. This alignment process is carried out one or more times, desirably, two or more times. When the relative positions respectively measured in two consecutive operations agree with each other with an allowable error or less determined in advance, alignment between the arrayed fibers 730 and the first and the second alignment optical measurement elements 720 and 721 is completed. Inasmuch as details of the alignment are basically similar to those described above, description thereof will be omitted.

Subsequently, by using data about relative positions of the first and second alignment optical measurement elements 720 and 721 and the first through fourth optical input/output grating couplers 701 to 704, the arrayed fibers 730 are moved so that the first through fourth optical fibers 731 to 734 are aligned with the first through fourth optical input/output grating couplers 701 to 704, respectively, as shown in FIG. 7C. Through these operations in a series, alignment between the arrayed fibers 730 and the first through fourth optical input/output grating couplers 701 to 704 is completed.

In the fourth example embodiment, it is possible to make the number of the optical fibers included in the arrayed fibers 730 of the optical probe agree to the number of the optical input/output grating couplers of the optical circuit included in the optical chip.

In comparison, in a case of using the related art, it is required to connect the first alignment optical measurement element 720 (the first grating coupler 201) and the second alignment optical measurement element 721 (the second grating coupler 207) with the optical waveguide 208 as illustrated in FIG. 2 at the same time. In addition, it is required to simultaneously couple the first alignment optical measurement element 720, the second alignment optical measurement element 721, and the first through fourth optical input/output grating couplers 701 to 704 with the arrayed fibers. As a result, in the related art, the arrayed fibers must comprise six optical fibers (six channels) instead of four optical fibers (four channels) by adding two more optical fibers to be coupled to the first and second alignment optical measurement elements 720 and 721. As explained above, in the related art, excessive optical fibers should be included in the arrayed fibers, although they are not used for the optical circuit. According to the above-mentioned fourth example embodiment of the present invention, there is no need to provide the excessive optical fibers.

In the above-mentioned fourth example embodiments of the present invention, alignment is carried between one of the optical fibers in the arrayed fibers 703 and one of the two alignment optical measurement elements disposed on both sides of the optical input/output grating couplers. However, according to this invention, a plurality of alignment optical measurement elements may be provided to each side of the row of optical input/output grating couplers, and alignment may be carded out between two or more of the plurality of optical fibers in the arrayed fibers and two or more alignment optical measurement elements.

In any event, in this invention, the arrangement of a plurality of optical fibers included in the arrayed fibers can be the same as that of a plurality of optical input/output grating couplers in the optical circuit of the optical chip. After carrying out alignment using the alignment optical measurement element, all of the optical input/output grating couplers in the optical circuit included in the optical chip can be aligned with the optical fibers of the above-mentioned arrayed fibers using known data regarding the relative positions of the alignment optical measurement elements.

While the alignment optical measurement element according to the above-mentioned example embodiments of the present invention and the alignment method using this are described for wafer testing, the present invention may also be carried out for individually diced optical chips. Alignment carried out in that situation can often happen when optical fibers are attached to optical chips for production. In such a case, after alignment is carried out between all of the optical input/output grating couplers of the optical circuit included in the optical chip and the optical fibers of the arrayed fibers, the arrayed fibers may be fixed to the optical chip as they are. The fixing may be carried out, for example, by applying ultraviolet-curing resin in between the joining faces of the optical fibers and the optical input/output grating couplers and irradiating ultraviolet light to them.

While the invention has been particularly shown and described with reference to example embodiments thereof, the invention is not limited to these embodiments. It will be understood by those of ordinary skilled in the art that various changes in form and details may be made therein without departing from the sprit and scope of the present invention as defined by the claims.

What is claimed is:

1. A method for aligning an optical probe using an alignment optical measurement element, the alignment optical measurement element comprising:

a grating coupler comprising a core and a coupler grating; and a reflector coupled to the grating coupler;

wherein the alignment optical measurement element is arranged so that: the grating coupler diffracts an incident light in a first direction by the coupler grating into a first diffracted light to propagate the first diffracted light as a first propagating light along the core in a second direction, the reflector reflects the first propagating light into a second propagating light along the core in a third direction opposite to the second direction; and the grating coupler diffracts the second propagating light by the coupler grating into a second diffracted light to emit the second diffracted light as an emitted light in a fourth direction opposite to the first direction, the method comprising:

bringing the optical probe in the vicinity of the grating coupler of the alignment optical measurement element;

inputting an emitted light from the optical probe to the grating coupler as an incident light;

collecting, in the optical probe, an emitted light from the grating coupler as a collected light;

measuring the intensity of the collected light with a photo detector to produce a measured value indicative of the light intensity; and adjusting a relative position of the optical probe with respect to a wafer so that the measured value is maximized.

2. The method as claimed in claim 1, wherein said reflector comprises a grating, a directional coupler, or a reflective component of metal.

3. The method as claimed in claim 1, wherein the optical probe comprises an optical fiber or a focusing optical system.

4. The method as claimed in claim 1, wherein the optical probe comprises arrayed fibers.

5. The method as claimed in claim 4, wherein the number of the arrayed fibers is equal to that of optical input/output grating couplers of an optical circuit included in a single optical chip.

6. The method as claimed in claim 5, wherein said method further comprises carrying out alignment using at least one of said arrayed fibers and at least one of alignment optical measurement elements.

7. The method as claimed in claim 6, wherein the arrangement of the arrayed fibers is identical with that of the plurality of optical input/output grating couplers of the optical circuit included in the single optical chip, wherein the method further comprising, after carrying out alignment using the alignment optical measurement elements, aligning all of the plurality of optical input/output grating couplers of the optical circuit included in said single optical chip with said arrayed fibers using known data about relative positions with respect to the alignment optical measurement elements.

8. The method as claimed in claim 7, wherein the method further comprising, after aligning all of the plurality of optical input/output grating couplers of the optical circuit included in said single optical chip with said arrayed fibers, fixing said arrayed fibers to said single optical chip.

* * * * *

UNITED STATES PATENT AND TRADEMARK OFFICE
CERTIFICATE OF CORRECTION

PATENT NO. : 10,088,299 B2  
APPLICATION NO. : 15/641384  
DATED : October 2, 2018  
INVENTOR(S) : Masatoshi Tokushima Page 1 of 1

It is certified that error appears in the above-identified patent and that said Letters Patent is hereby corrected as shown below:

In the Specification

Column 6, Detailed Description of Exemplary Embodiments, Line 65; Delete "coupler it" and insert --coupler. It-- therefor Column 10, Detailed Description of Exemplary Embodiments, Line 26; Delete "carded" and insert --carried-- therefor Signed and Sealed this  
Nineteenth Day of March, 2019

Andrei Iancu  
*Director of the United States Patent and Trademark Office*